(12) United States Patent
Kim et al.

(10) Patent No.: US 9,231,225 B2
(45) Date of Patent: Jan. 5, 2016

(54) ORGANIC LIGHT-EMITTING DEVICE

(71) Applicant: SAMSUNG DISPLAY CO., LTD., Yongin, Gyeonggi-Do (KR)

(72) Inventors: Eung-Do Kim, Yongin (KR); Dong-Chan Kim, Yongin (KR); Won-Jong Kim, Yongin (KR); Dong-Kyu Seo, Yongin (KR); Seok-Gyu Yoon, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/333,766

(22) Filed: Jul. 17, 2014

(65) Prior Publication Data
US 2015/0263306 A1 Sep. 17, 2015

(30) Foreign Application Priority Data
Mar. 11, 2014 (KR) .................. 10-2014-0028600

(51) Int. Cl.
*H01L 51/54* (2006.01)
*H01L 51/50* (2006.01)
*H01L 51/00* (2006.01)
*H01L 51/52* (2006.01)

(52) U.S. Cl.
CPC ........ *H01L 51/5092* (2013.01); *H01L 51/0058* (2013.01); *H01L 51/0059* (2013.01); *H01L 51/0082* (2013.01); *H01L 51/0096* (2013.01); *H01L 51/506* (2013.01); *H01L 51/5012* (2013.01); *H01L 51/5072* (2013.01); *H01L 51/5221* (2013.01); *H01L 2251/308* (2013.01)

(58) Field of Classification Search
None
See application file for complete search history.

(56) References Cited

U.S. PATENT DOCUMENTS

| 2001/0031380 A1 | 10/2001 | Yoon et al. |
| 2003/0143428 A1 | 7/2003 | Kim et al. |

(Continued)

FOREIGN PATENT DOCUMENTS

| JP | 2001351785 | 12/2001 |
| KR | 2001-0021486 | 3/2001 |

(Continued)

OTHER PUBLICATIONS

Ahn, Hyuk, Hyunkoo Lee, Jungjin Yang, and Changhee Lee. "P-112: Highly Efficient Electron Injection Layer of LiF/Yb Bilayer for Top-emitting Organic Light Emitting Diodes." SID Symposium Digest of Technical Papers 43.1 (2012): 1481-483.*

(Continued)

*Primary Examiner* — Joseph Schoenholtz
(74) *Attorney, Agent, or Firm* — Lee & Morse, P.C.

(57) ABSTRACT

An organic light-emitting device may include a substrate; an anode on the substrate; a hole transport region on the anode; an emission layer on the hole transport region; an electron transport region on the emission layer; and a cathode on the electron transport region. The electron transport region may include an electron injection layer including a first component which is a salt chloride and a second component which is at least one metal selected from ytterbium (Yb), scandium (Sc), vanadium (V), yttrium (Y), indium (In), cerium (Ce), samarium (Sm), europium (Eu), and terbium (Tb). In addition, the cathode may contacts the electron injection layer and may include an alloy of a first cathode metal including at least one of Ag, Au, Pt, Cu, Mn, Ti, Co, Ni, and W, and a second cathode metal including least one of Yb, Sc, V, Y, In, Ce, Sm, Eu, and Tb.

21 Claims, 4 Drawing Sheets

(56) References Cited

U.S. PATENT DOCUMENTS

| | | | |
|---|---|---|---|
| 2008/0157663 A1 | 7/2008 | Sung et al. | |
| 2010/0096622 A1 | 4/2010 | Iizumi et al. | |
| 2010/0301741 A1* | 12/2010 | Kim et al. | 313/504 |
| 2012/0112628 A1 | 5/2012 | Yoon et al. | |
| 2012/0292605 A1* | 11/2012 | Park et al. | 257/40 |
| 2013/0076251 A1 | 3/2013 | Lee et al. | |
| 2014/0091287 A1* | 4/2014 | Sago | 257/40 |

FOREIGN PATENT DOCUMENTS

| | | |
|---|---|---|
| KR | 2003-0081833 | 6/2003 |
| KR | 10-2008-0061732 | 7/2008 |
| KR | 10-2009-0121317 | 11/2009 |
| KR | 10-2012-0049639 | 5/2012 |
| KR | 10-2012-0128483 | 11/2012 |
| KR | 10-2013-0032675 | 4/2013 |

OTHER PUBLICATIONS

Lü, Zhaoyue, Yongsheng Wang, Ye Zou, Hailiang Du, Zheng Chen, and Zhenbo Deng. "The Effect of Alkaline Metal Chlorides on the Properties of Organic Light-emitting Diodes." Journal of Luminescence 130.3 (2010): 387-91.*

Yoon, Woo-Jun, Scott B. Orlove, Robert L. Olmon, and Paul R. Berger. "Enhanced Emission Using Thin Li-Halide Cathodic Interlayers for Improved Injection into Poly(p-phenylene Vinylene) Derivative PLEDs." Electrochemical and Solid-State Letters 11.10 (2008): J76.*

Zhu, X. L., J. X. Sun, X. M. Yu, M. Wong, and H. S. Kwok. "29.3: Very Bright and Efficient Top-Emitting OLED with Ultra-Thin Yb as Effective Electron Injector." SID Symposium Digest of Technical Papers 37.1 (2006): 1292.*

Lü, Zhaoyue, Zhenbo Deng, Jianjie Zheng, Enyu Zhou, Zheng Chen, Denghui Xu, and Yongsheng Wang. "Organic Light-emitting Diodes Using Potassium Chloride as Efficiency and Stability Enhancers." Displays 31.1 (2010): 54-58.*

Lü, Zhaoyue, Zhenbo Deng, Hailiang Du, Degang Li, Ye Zou, Denghui Xu, Zheng Chen, and Yongsheng Wang. "The Effect of Rubidium Chloride on Properties of Organic Light-emitting Diodes." Solid-State Electronics 53.11 (2009): 1154-158.*

Ytterbium Element Facts downloaded from URL <http://www.chemicool.com/elements/ytterbium.html> on May 6, 2015.*

Ytterbium downloaded from URL<http://www.hobart.k12.in.us/ksms/PeriodicTable/ytterbium.htm> on May 6, 2015.*

* cited by examiner

ORGANIC LIGHT-EMITTING DEVICE

CROSS-REFERENCE TO RELATED APPLICATION

Korean Patent Application No. 10-2014-0028600, filed on Mar. 11, 2014, in the Korean Intellectual Property Office, and entitled: "Organic Light-Emitting Device," is incorporated by reference herein in its entirety.

BACKGROUND

1. Field

One or more embodiments relate to an organic light-emitting device, and in particular, to an organic light-emitting device including an electron injection layer.

2. Description of the Related Art

An organic light-emitting device may include a material which self-emits light when electric voltage is applied to the material and may exhibit high brightness, excellent contrast, full-color image production, wide viewing angles, high response rates, and low driving voltages.

SUMMARY

An organic light-emitting device may include a substrate; an anode on the substrate; a hole transport region on the anode; an emission layer on the hole transport region; an electron transport region on the emission layer; and a cathode on the electron transport region. The electron transport region may include an electron injection layer including a first component including a chloride of alkali metal and a second component including at least one metal selected from ytterbium (Yb), scandium (Sc), vanadium (V), yttrium (Y), indium (In), cerium (Ce), samarium (Sm), europium (Eu), and terbium (Tb). The cathode may contact the electron injection layer and may include an alloy of a first cathode metal including at least one metal selected from silver (Ag), gold (Au), platinum (Pt), copper (Cu), manganese (Mn), titanium (Ti), cobalt (Co), nickel (Ni), and tungsten (W), and a second cathode metal including at least one metal selected from Yb, Sc, V, Y, In, Ce, Sm, Eu, and Tb.

The first component may include lithium chloride (LiCl), sodium chloride (NaCl), potassium chloride (KCl), rubidium chloride (RbCl), or cesium chloride (CsCl).

The electron injection layer may be formed by co-deposition of the first component and the second component.

The electron injection layer may be formed by co-deposition of RbCl and Yb.

A volume ratio of the first component to the second component in the electron injection layer may range from about 4:6 to about 6:4.

The thickness of the electron injection layer may range from about 10 Å to about 30 Å.

The electron injection layer may include a first layer including the first component and a second layer including the second component. The electron injection layer may include a first layer including the second component and a second layer including the first component.

The first layer may be a RbCl layer, and the second layer may be a Yb layer.

The first layer may be a Yb layer, and the second layer may be a RbCl layer.

A thickness of the first layer may range from about 5 Å to about 15 Å, and a thickness of the second layer may range from about 5 Å to about 15 Å.

The second cathode metal of the cathode may be the same as the second component of the electron injection layer.

The second cathode metal of the cathode may be Yb.

The cathode may be Ag:Yb.

A volume ratio of the first cathode metal to the second cathode metal in the cathode may range from about 7:1 to about 3:1.

The electron transport region may include an electron transport layer between the electron injection layer and the emission layer.

The electron transport layer may include at least one of $Alq_3$, 2,9-dimethyl-4,7-diphenyl-1,10-phenanthroline (BCP) 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAlq), beryllium bis(benzoquinolin-10-olate) ($Bebq_2$), and 9,10-di(naphthalene-2-yl) anthracene (ADN).

The hole transport region may include at least one layer selected from a hole injection layer, a hole transport layer, and an electron blocking layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
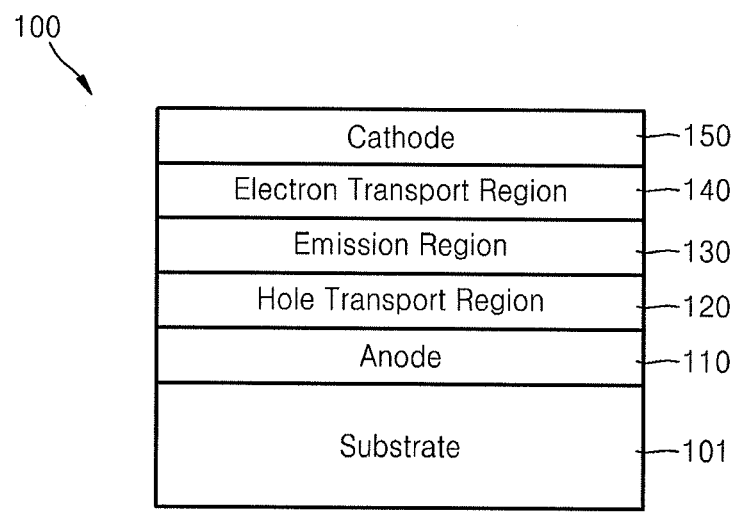
FIG. 1 illustrates a schematic diagram of an organic light-emitting device according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Expressions such as "at least one of," when preceding a list of elements, modify the entire list of elements and do not modify the individual elements of the list. Like reference numerals refer to like elements throughout.

FIG. 1 illustrates a schematic diagram of an organic light-emitting device 100 according to one embodiment. The organic light-emitting device 100 may include a substrate 101, an anode 110, a hole transport region 120, an emission region 130, an electron transport region 140, and a cathode 150, which may be formed sequentially. Hereinafter, each region of the organic light-emitting device 100 may be described based on its function.

Holes injected from an anode 110 may be injected to the emission region 130 through the hole transport region 120, while electrons injected from the cathode 150 may be injected to the emission region 130 through the electron transport region 140. Holes and electrons may bind in the emission region 130 to generate excitons.

Each of the hole transport region 120, the emission region 130, and the electron transport region 140 may have a layer structure including a single layer or two or more layers.

The hole transport region 120 may include at least one selected from a hole injection layer, a hole transport layer, an electron blocking layer, and a hole transport region auxiliary layer. The term "hole injection layer" refers to a layer having the function of assisting holes to be injected from an anode to an organic layer, and the term "hole transport layer" refers to a layer having the function of transporting holes to an emission layer. The term "electron blocking layer" refers to a layer having the function of blocking electrons from flowing through an emission region to an anode, and the term "hole transport region auxiliary layer" may refer to various layers having various functions as known to those of skill in the art, such as a layer for securing an optical resonance distance.

The electron transport region 140 may further include at least one selected from an electron injection layer, an electron transport layer, a hole blocking layer, and an electron transport region auxiliary layer. The term "electron injection layer" refers to a layer having the function of assisting electrons to be injected from a cathode to an organic layer, and the term "electron transport layer" refers to a layer having the function of transporting electrons to an emission layer. The term "hole blocking layer" refers to a layer having the function of blocking holes from flowing through an emission region to a cathode, and the term "electron transport region auxiliary layer" refers to various layers having various other functions known to those of skill in the art.

In the present embodiment, the electron transport region 140 may include an electron injection layer including a chloride of an alkali metal and at least one metal selected from ytterbium (Yb), scandium (Sc), vanadium (V), yttrium (Y), indium (In), cerium (Ce), samarium (Sm), europium (Eu), and terbium (Tb).

The chloride of an alkali metal may affect an electric field applied to a device by polarizing action so that electron injection from a cathode may be easily performed, and Yb, Sc, V, Y, In, Ce, Sm, Eu, and Tb, which are metals having a low working function, may also make electron injection from a cathode more easily performed.

The cathode 150 may contact the electron injection layer and include at least one metal selected from silver (Ag), gold (Au), platinum (Pt), copper (Cu), manganese (Mn), titanium (Ti), cobalt (Co), nickel (Ni), and tungsten (W) and at least one metal selected from Yb, Sc, V, Y, In, Ce, Sm, Eu, and Tb.

By combination of the material of the electron injection layer and the material of the cathode 150, an organic light-emitting device 100 according to the present embodiment may show excellent electron injection properties, excellent efficiency properties such as low resistance and low light absorption, and improved device lifespan.

Figure 2:
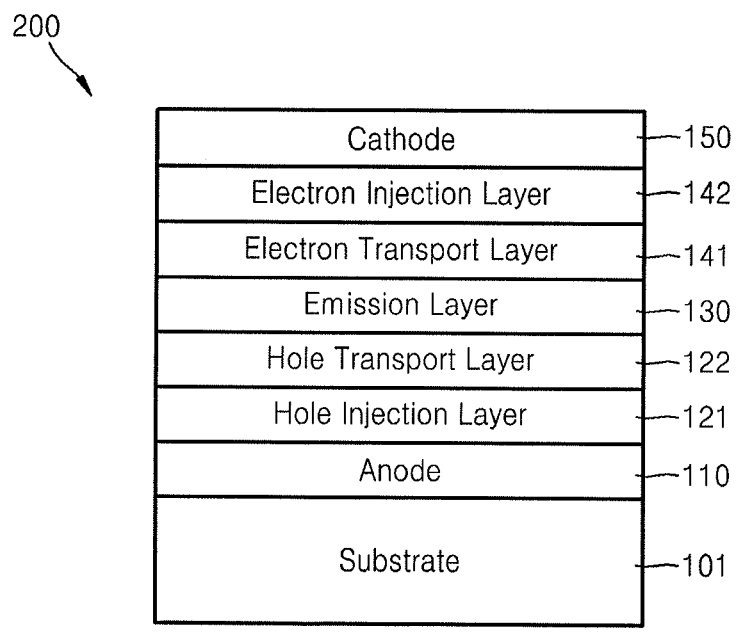
FIG. 2 illustrates a schematic diagram of an organic light-emitting device according to another embodiment.

FIG. 2 illustrates a schematic diagram of an organic light-emitting device according to another embodiment.

The organic light-emitting device 200 may include a substrate 101, an anode 110, a hole injection layer 121, a hole transport layer 122, an emission layer 130, an electron transport layer 141, an electron injection layer 142, and a cathode 150. Hereinafter, each layer of the organic light-emitting device 200 is specifically described.

The substrate 101 may be a substrate which is commonly used in an organic light-emitting device. The substrate 101 may be formed by using a glass substrate or a transparent plastic substrate having excellent mechanical strength, thermal stability, transparency, surface smoothness, ease of handling, and water repellency. On the other hand. A substrate may include an opaque material such as silicon and stainless steel.

The anode 110 may be formed on the substrate 101. The anode 110 may include a material having a relatively high work function. The anode 110 may include, for example, indium tin oxide (ITO), indium zinc oxide (IZO), tin oxide ($SnO_2$), or zinc oxide (ZnO), but is not limited thereto. The anode 110 may be formed by deposition or sputtering of a material on a substrate.

The hole injection layer 121 may be formed on the anode 110. The hole injection layer 121 may include a phthalocyanine compound such as copper phthalocyanine; a diamine or triamine compound such as N,N'-diphenyl-N,N'-bis-[4-(phenyl-m-tolyl-amino)-phenyl]-biphenyl-4,4'-diamine (DNTPD), 4,4',4"-tris(N-3-methylphenyl-N-phenylamino)triphenylamine (m-MTDATA), 4,4'4"-tris(N,N-diphenylamino)triphenylamine (TDATA), and 4,4'4'-tris(N-(2-naphthyl)-N-phenyl-amino)-triphenylamine (2T-NATA); or a polymer compound such as poly(3,4-ethylenedioxythiophene/poly(4-styrenesulfonate) (PEDOT/PSS), polyaniline/dodecylbenzene sulfonic acid (PANI/DBSA), polyaniline/camphor sulfonic acid (PANI/CSA), and polyaniline/poly(4-styrenesulfonate) (PANI/PSS), but is not limited thereto.

The hole injection layer 121 may be formed by using various methods such as vacuum deposition, spin coating, casting, and a Langmuir-Blodgett (LB) method.

When the hole injection layer 121 is formed by vacuum deposition, the deposition conditions may be dependent on the compound used as a material for the hole injection layer 121 and the desired properties of the hole injection layer 121, and may be, for example, a deposition temperature range from about 100° C. to about 500° C., a vacuum level range from about $10^{-8}$ Torr to about $10^{-3}$ Torr, and a deposition rate range from about 0.01 Å/sec and to about 100 Å/sec.

When the hole injection layer 121 is formed by spin coating, the coating conditions may be dependent on the compound used as a material for the hole injection layer 121 and the desired properties of the hole injection layer 121, and may be, for example, a spin rate from about 2,000 rpm and to about 5,000 rpm and a temperature range of a thermal treatment temperature for solvent removal after coating from about 80° C. to about 200° C.

The thickness of the hole injection layer 121 may be from about 100 Å to about 10,000 Å, and more appropriately, from about 100 Å to about 1,000 Å. When the thickness of the hole injection layer 121 is in the range described above, satisfactory hole injection properties may be obtained without a decrease in a substantial drive voltage.

The hole transport layer 122 may be formed on the hole injection layer 121. The hole transport layer 122 may include, for example, a carbazole derivative such as N-phenylcarbazole and polyvinyl carbazole; a triphenylamine compound such as N,N'-bis(3-methylphenyl)-N,N'-diphenylbenzidine (TPD) and 4,4',4''-tris(carbazol-9-yl)-triphenylamine (TCTA); or N,N'-di(1-naphthyl)-N,N'-diphenyl-(1,1'-biphenyl)-4,4'-diamine (NPB), but is not limited thereto.

The hole transport layer 122 may be formed by various methods including vacuum deposition, spin coating, casting, and an LB method.

When the hole transport layer 122 is formed by vacuum deposition or spin coating, the deposition conditions and the coating conditions may be dependent on the compound used as a material for the hole transport layer 122 and may be condition ranges that are the same or about the same as those for the formation of the hole injection layer 121.

The thickness of the hole transport layer 122 may range from about 50 Å to about 1,000 Å, for example, from about 100 Å to about 800 Å. When the thickness of the hole transport layer 122 is in the range described above, satisfactory hole transport properties may be obtained without an increase in a substantial drive voltage.

At least one of the hole injection layer 121 and the hole transport layer 122 may further include a charge-generation material that may improve membrane conductive properties in addition to known hole injection materials and hole transport materials as described above.

The charge-generation material may include, for example, a p-dopant. Non-limiting examples of the p-dopant include a quinone derivative such as tetracyanoquinonedimethane (TCNQ) or 2,3,5,6-tetrafluoro-tetracyano-1,4-benzoquinonedimethane (F4-TCNQ); and a metal oxide such as a tungsten oxide or a molybdenum oxide, but is not limited thereto.

When the hole injection layer or the hole transport layer further includes the charge-generation material, various modifications may be made, and the charge-generation material may be distributed homogeneously or unhomogeneously among the layers.

The emission layer 130 may be formed on the hole transport layer 122. The emission layer 130 may be formed by various methods including vacuum deposition, spin coating, casting, and an LB method. When the emission layer 130 is formed by vacuum deposition or spin coating, the deposition conditions and the coating conditions may be dependent on the compound used as a material for the emission layer 130 and may include the condition ranges that are the same or about the same as those for the formation of a hole injection layer.

The emission layer material may include at least one material selected from known light emitting materials (including both a host and a dopant).

A host may include, for example, tris-(8-hydroxyquinoline)aluminum ($Alq_3$), 4 4'-bis(n-carbazolyl)-1 1'-biphenyl (CBP), poly(n-vinylcarbazole) (PVK), poly(N-vinylcarbazole), 9,10-di(naphthalen-2-yl)anthracene (ADN), 4,4',4''-tris(carbazol-9-yl)-triphenylamine (TCTA), 1,3,5-tris(N-phenylbenzimidazole-2-yl)benzene (TPBI), 3-tert-butyl-9,10-di(naphth-2-yl)anthracene (TBADN), distyrylarylene (DSA), E3 or 4,4'-bis(9-carbazolyl)-2,2'-dimethylbiphenyl (CDBP), but is not limited thereto.

The dopant may include at least one known dopant. The dopant may include a fluorescent dopant and/or a phosphorescent dopant. A phosphorescent dopant may be an organometallic complex including Ir, Pt, Os, Re, Ti, Zr, Hf, or a combination of two or more thereof, but is not limited thereto.

A red dopant may be Pt(II) octaethylporphyrin (PtOEP), tris(2-phenylisoquinoline)iridium ($Ir(piq)_3$), or bis(2-(2'-benzothienyl)-pyridinato-N,C3')iridium(acetylacetonate) ($Btp_2Ir(acac)$), but is not limited thereto.

In addition, a green dopant may be tris(2-phenylpyridine) iridium ($Ir(ppy)_3$), bis(2-phenylpyridine)(acetylacetonato) iridium(III) ($Ir(ppy)_2(acac)$), tris(2-(4-tolyl)phenylpyridine) iridium ($Ir(mppy)_3$), or 10-(2-benzothiazolyl)-1,1,7,7-tetramethyl-2,3,6,7-tetrahydro-1H,5H,11H-[1]benzopyrano[6,7,8-ij]-quinolizin-11-one (C545T), but is not limited thereto.

A blue dopant may be bis[3,5-difluoro-2-(2-pyridyl)phenyl](picolinato)iridium(III) ($F_2Irpic$), ($F_2ppy)_2Ir(tmd)$, $Ir(dfppz)_3$, 4,4'-bis(2,2'-diphenylethen-1-yl)biphenyl (DPVBi), 4,4'-bis[4-(diphenylamino)styryl]biphenyl (DPAVBi), or 2,5,8,11-tetra-tert-butyl perylene (TBPe), but is not limited thereto.

When the emission layer 130 includes a host and a dopant, the amount of the dopant may range from about 0.01 to about 15 parts by weight with respect to about 100 parts by weight of a host, but is not limited thereto.

The thickness of the emission layer 130 may range from about 100 Å to about 1,000 Å, for example, from about 200 Å to about 600 Å. When the thickness of the emission layer 130 is in the range described above, satisfactory light emitting properties may be obtained without an increase in a substantial drive voltage.

The electron transport layer 141 may be formed on the emission layer 130. The electron transport layer 141 may include $Alq_3$, 2,9-dimethyl-4,7-diphenyl-1,10-phenanthroline (BCP) 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAlq), beryllium bis(benzoquinolin-10-olate) ($Bebq_2$), and 9,10-di(naphthalene-2-yl) anthracene (ADN), but is not limited thereto.

The electron transport layer 141 may be formed by various methods such as vacuum deposition, spin coating, and casting. When the electron transport layer 141 is formed by vacuum deposition or spin coating, the deposition conditions and the coating conditions may be dependent on the compound used as a material for the electron transport layer 141 and may include the condition ranges that are the same or about the same as those for the formation of the hole injection layer 121.

The thickness of the electron transport layer 141 may range from about 100 Å to about 1,000 Å, for example, from about 150 Å to about 500 Å. When the thickness of the electron transport layer 141 is in the range described above, satisfactory electron transport properties may be obtained without an increase in a substantial drive voltage.

In exemplary embodiments, the electron transport layer 141 may include an electron-transporting organic compound and a metal-containing material. The metal-containing material may include a Li complex. A non-limiting example of the Li complex is lithium-quinolate (LiQ).

The electron injection layer 142 may be formed on top of the electron transport layer 41. The electron injection layer 142 may include a chloride of an alkali metal and at least one metal including Yb, Sc, V, Y, In, Ce, Sm, Eu, and Tb.

The chloride of an alkali metal may include, for example, lithium chloride (LiCl), sodium chloride (NaCl), potassium chloride (KCl), rubidium chloride (RbCl), or cesium chloride (CsCl).

The electron injection layer 142 may be formed by co-deposition of the chloride of an alkali metal and the metal component. The ratio (by weight) of the chloride of an alkali metal to the metal component may range from about 4:6 to about 6:4.

The thickness of the electron injection layer 142 may range from about 5 Å to about 10 Å, for example, from about 10 Å to about 30 Å. When the thickness of the electron injection layer 142 is in the range described above, satisfactory electron injection properties may be obtained without an increase in a substantial drive voltage.

The cathode 150 may be formed on the electron injection layer 142. The cathode 150 may be formed by using an alloy having a low work function. The alloy may include, for example, a first cathode metal including at least one of Ag, Au, Pt, Cu, Mn, Ti, Co, Ni, and W, and a second cathode metal including at least one of Yb, Sc, V, Y, In, Ce, Sm, Eu, and Tb. The weight ratio of the first cathode metal to the second cathode metal may range from about 7:1 to about 3:1.

The cathode 150 may be formed by, for example, vacuum deposition. The thickness of the cathode 150 may range, for example, from about 10 Å to about 300 Å or from about 20 Å to about 200 Å.

Figure 3:
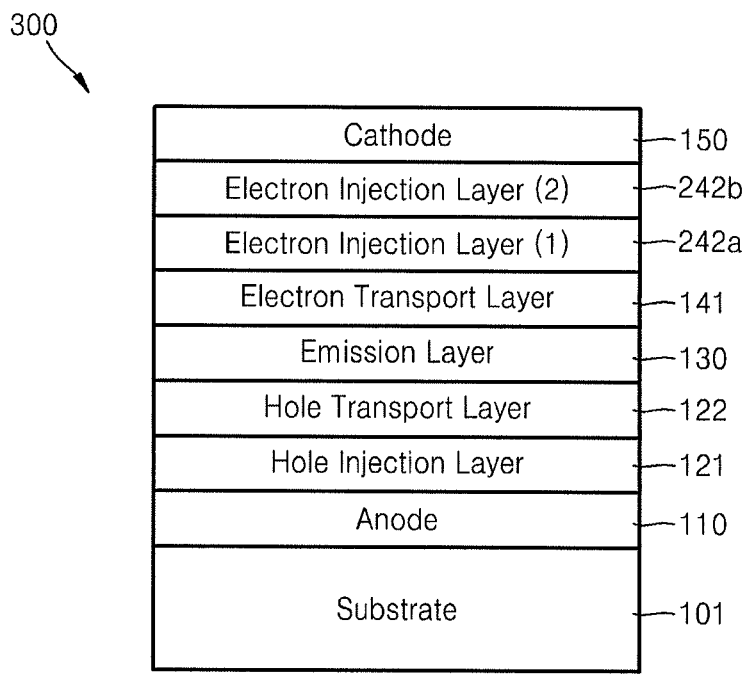
FIG. 3 illustrates a schematic diagram of an organic light-emitting device according to another embodiment.

FIG. 3 illustrates a schematic diagram of an organic light-emitting device 300 according to another embodiment.

The organic light-emitting device 300 illustrated in FIG. 3 may have the same structure as the organic light-emitting device 100, except that an electron injection layer 242 may include two layers including a first electron injection layer 242a and a second electron injection layer 242b.

The first electron injection layer 242a may include a chloride of an alkali metal. The chloride of an alkali metal may include, for example, LiCl, NaCl, KCl, RbCl, or CsCl.

The second electron injection layer 242b may be formed by using at least one metal including Yb, Sc, V, Y, In, Ce, Sm, Eu, and Tb.

The positions of the first electron injection layer 242a and the second electron injection layer 242b may be reversed. In other words, the first electron injection layer 242a may contact an electron transport layer 141 and the second electron injection layer 242b may contact a cathode 150, or the second electron injection layer 242b may contact an electron transport layer 141 and the first electron injection layer 242a may contact a cathode 150.

As described in relation to the organic light-emitting device 100 shown in FIG. 1, the organic light-emitting devices of exemplary embodiments may further include at least one layer including a hole blocking layer, an electron blocking layer, a hole transport region auxiliary layer, and an electron transport region auxiliary layer.

Exemplary embodiments may be incorporated into various structures of organic light-emitting devices such as an organic light-emitting device emitting a single color, an organic light-emitting device emitting multiple colors, and an organic light-emitting device emitting a white color. The embodiments of the present invention may be both a top emission-type light-emitting device and a bottom emission-type light-emitting device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

A 15 Ω/cm² (1200 Å) ITO glass substrate (Corning) was ultrasonic-cleaned with an isopropyl alcohol and pure water for five minutes each and then UV radiation and ozone-cleaned for 30 minutes to form an anode on the ITO glass substrate. 2-TNATA was vacuum-deposited on the top of the ITO glass substrate to form a 600 Å thick hole injection layer and then NPB was vacuum-deposited on the hole injection layer to form a 300 Å thick hole transport layer. On top of the hole transport layer, ADN 98 wt % was used as a host and DPAVBi 2 wt % was used as a dopant to form a 300 Å thick emission layer. On top of the emission layer, $Alq_3$ was vacuum-deposited to form a 300 Å thick electron transport layer. On top of the electron transport layer, Yb and RbCl were co-deposited at a ratio of 1:1 (Yb:RbCl) (volume ratio) to form a 15 Å thick electron injection layer, and then Ag and Yb were co-deposited at a ratio of 5:1 (Ag:Yb) (volume ratio) to form a 90 Å thick cathode to complete the manufacture of an organic light-emitting device.

Example 2

An organic light-emitting device was formed by the same method as Example 1, except that Yb was vacuum-deposited to a 10 Å thickness, instead of co-depositing Yb and RbCl at a ratio of 1:1 (volume ratio) to a 15 Å thickness, and that RbCl was vacuum-deposited to a 10 Å thickness to form an electron injection layer.

Example 3

An organic light-emitting device was formed by the same method as Example 1, except that Yb and RbCl were co-deposited at a ratio of 1:1 (volume ratio) to form an electron injection layer to a 20 Å thickness instead of a 15 Å thickness.

Comparative Example 1

An organic light-emitting device was formed by the same method as Example 1, except that Yb was vacuum-deposited to a 15 Å thickness instead of co-depositing Yb and RbCl at a ratio of 1:1 (volume ratio) to a 15 Å thickness.

Comparative Example 2

An organic light-emitting device was formed by the same method as Example 1, except that RbCl was vacuum-deposited to a 15 Å thickness instead of co-depositing Yb and RbCl at a ratio of 1:1 (volume ratio) to a 15 Å thickness.

Figure 4:
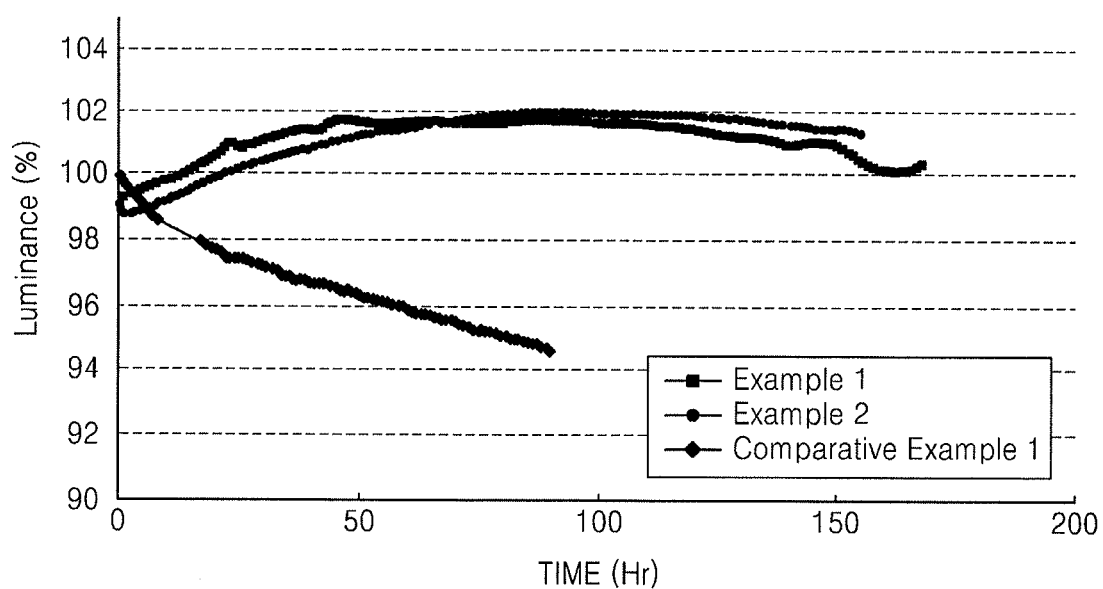
FIG. 4 illustrates a graph showing luminance measurements of the organic light-emitting devices of Example 1, Example 2, and Comparative Example 1 over time.

FIG. 4 illustrates a graph showing luminance measurements of the organic light-emitting devices of Example 1, Example 2, and Comparative Example 1 over time. The graph in FIG. 4 shows luminance data measured under the constant current drive condition of 10 mA/cm².

The graph in FIG. 4 shows that it took about 32 hours for the luminance of the organic light-emitting device of Comparative Example 1 to decrease to 97% of the initial luminance, while the organic light-emitting devices of Example 1 and Example 2 maintained the initial luminance for more than 150 hours. The result shows that the organic light-emitting devices of Example 1 and Example 2 surprisingly and unexpectedly exhibit a greatly improved lifespan in comparison with the organic light-emitting device of Comparative Example 1.

Figure 5:
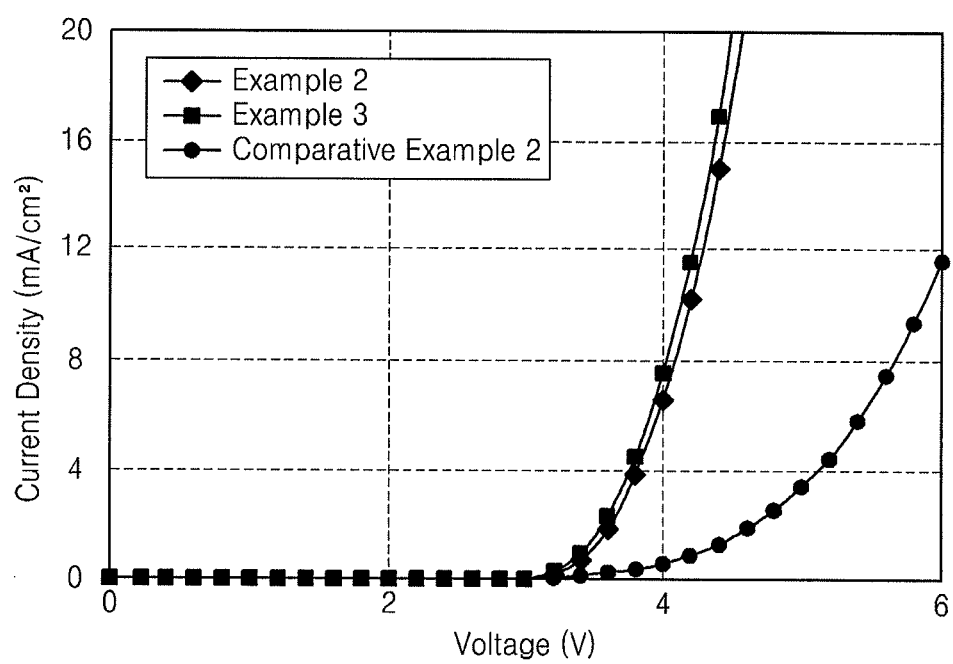
FIG. 5 illustrates a graph showing measured current density versus voltage of the organic light-emitting devices of Example 2, Example 3, and Comparative Example 2.

FIG. 5 illustrates a graph showing measured current density versus voltage of the organic light-emitting devices of Example 2, Example 3, and Comparative Example 2. The graph in FIG. 5 shows that the current density of the organic light-emitting devices of Example 2 and Example 3 was four times or more greater than that of the organic light-emitting device of Comparative Example 2 at the same voltage. The result shows that the electron injection efficiency of the organic light-emitting devices of Example 2 and Example 3 was surprisingly and unexpectedly much greater than that of the organic light-emitting device of Comparative Example 2.

Figure 6:
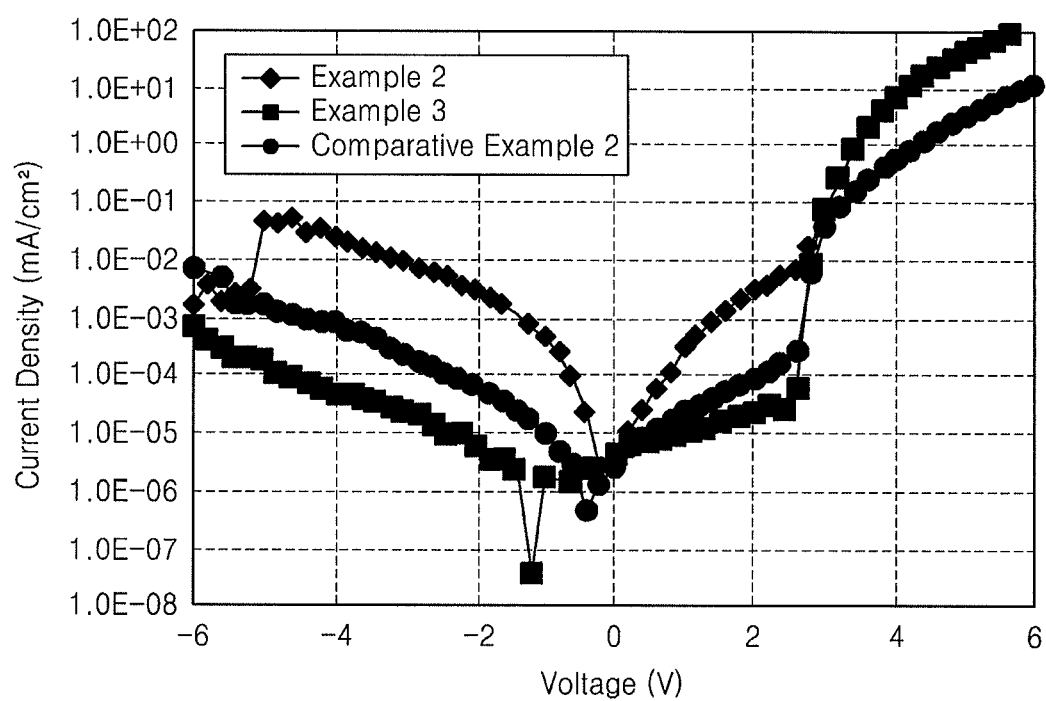
FIG. 6 illustrates a graph showing measured current density versus voltage of the organic light-emitting devices of Example 2, Example 3, and Comparative Example 2 in an off-current region.

FIG. 6 illustrates a graph showing measured current density versus voltage of the organic light-emitting devices of Example 2, Example 3, and Comparative Example 2 in an off-current region. The graph in FIG. 6 shows that the off-current value was similar among the organic light-emitting devices of Example 2, Example 3, and Comparative Example 2. In particular, the off-current value of the organic light-emitting device of Example 2 was the lowest. The result shows that the leakage current value of the organic light-emitting devices of Example 2 and Example 3 was good.

Table 1 shows the drive voltage and current efficiency of the organic light-emitting devices of Example 2, Example 3, and Comparative Example 2.

TABLE 1

|  | Electron injection layer | Drive voltage [V] | Efficiency (Cd/A) |
|---|---|---|---|
| Example 2 | Yb:RbCl 20 Å | 4.2 | 111.1 |
| Example 3 | Yb 10 Å/RbCl 10 Å | 4.3 | 104.7 |
| Comparative Example 2 | RbCl 15 Å | 6.0 | 111.2 |

Table 1 shows that the organic light-emitting device of Comparative Example 2 showed the highest efficiency as well as the highest drive voltage, while the drive voltage of the organic light-emitting devices of Example 2 and Example 3 was lower than the drive voltage of the organic light-emitting device of Comparative Example 2. Also, the efficiency of the organic light-emitting device of Example 2 was almost the same as that the efficiency of the organic light-emitting device of Comparative Example 2.

By way of summation and review, an organic light-emitting device may have a structure in which an organic emission layer is interposed between an anode and a cathode. When an electric voltage is applied, holes from the anode and electrons from the cathode may be injected to the organic emission layer. The injected holes and electrons may cause electron exchange with adjacent molecules in the organic emission layer and move to an opposite electrode. In addition, when an electron and a hole are recombined in a molecule, a molecular exciton having a high-energy excited state may be formed. When a molecular exciton returns to a low-energy ground state, light having the unique properties of the material may be emitted. To increase the light-emitting efficiency of an organic light-emitting device, not only an emission layer but also an electron injection layer, an electron transport layer, a hole injection layer, and a hole transport layer may be employed.

Important characteristics of an organic light-emitting device may be the efficiency and lifespan of the device. Efforts have been made to increase the efficiency and lifespan of organic light-emitting devices.

Exemplary embodiments provide an organic light-emitting device which may improve efficiency and lifespan. As described above, according to the one or more exemplary embodiments, the efficiency and lifespan of an organic light-emitting device may be improved by using a mixture of a chloride of an alkali metal and at least one metal selected from Yb, Sc, V, Y, In, Ce, Sm, Eu, and Tb for an electron injection layer and by using an alloy of at least one metal selected from Ag, Au, Pt, Cu, Mn, Ti, Co, Ni, and W and at least one metal selected from Yb, Sc, V, Y, In, Ce, Sm, Eu, and Tb to form a cathode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device comprising:
   a substrate;
   an anode on the substrate;
   a hole transport region on the anode;
   an emission layer on the hole transport region;
   an electron transport region on the emission layer; and
   a cathode on the electron transport region,
   wherein:
   the electron transport region includes an electron injection layer including a first component including a chloride of alkali metal and a second component including at least one metal selected from ytterbium (Yb), scandium (Sc), vanadium (V), yttrium (Y), indium (In), cerium (Ce), samarium (Sm), europium (Eu), and terbium (Tb), and
   the cathode contacts the electron injection layer and includes an alloy of a first cathode metal including at least one metal selected from silver (Ag), gold (Au), platinum (Pt), copper (Cu), manganese (Mn), titanium (Ti), cobalt (Co), nickel (Ni), and tungsten (W), and a second cathode metal including at least one metal selected from Yb, Sc, V, Y, In, Ce, Sm, Eu, and Tb.

2. The organic light-emitting device as claimed in claim 1, wherein the first component includes lithium chloride (LiCl), sodium chloride (NaCl), potassium chloride (KCl), rubidium chloride (RbCl), or cesium chloride (CsCl).

3. The organic light-emitting device as claimed in claim 1, wherein the electron injection layer contains a mixture of the first component and the second component.

4. The organic light-emitting device as claimed in claim 3, wherein the electron injection layer contains a mixture of RbCl and Yb.

5. The organic light-emitting device as claimed in claim 3, wherein a volume ratio of the first component to the second component in the electron injection layer ranges from about 4:6 to about 6:4.

6. The organic light-emitting device as claimed in claim 3, wherein a thickness of the electron injection layer ranges from about 10 Å to about 30 Å.

7. The organic light-emitting device as claimed in claim 1, wherein the electron injection layer includes a first layer including the first component and a second layer including the second component, the second layer being on the first layer.

8. The organic light-emitting device as claimed in claim 1, wherein the electron injection layer includes a first layer including the second component and a second layer including the first component, the second layer being on the first layer.

9. The organic light-emitting device as claimed in claim 7, wherein the first layer is a RbCl layer, and the second layer is a Yb layer.

10. The organic light-emitting device as claimed in claim 8, wherein the first layer is a Yb layer, and the second layer is a RbCl layer.

11. The organic light-emitting device as claimed in claim 7, wherein:
a thickness of the first layer ranges from about 5 Å to about 15 Å, and
a thickness of the second layer ranges from about 5 Å to about 15 Å.

12. The organic light-emitting device as claimed in claim 1, wherein the second cathode metal of the cathode is the same as the second component of the electron injection layer.

13. The organic light-emitting device as claimed in claim 9, wherein the second cathode metal of the cathode is Yb.

14. The organic light-emitting device as claimed in claim 10, wherein the second cathode metal of the cathode is Yb.

15. The organic light-emitting device as claimed in claim 1, wherein the cathode is Ag:Yb.

16. The organic light-emitting device as claimed in claim 1, wherein a volume ratio of the first cathode metal to the second cathode metal in the cathode ranges from about 7:1 to about 3:1.

17. The organic light-emitting device as claimed in claim 1, wherein the electron transport region includes an electron transport layer between the electron injection layer and the emission layer.

18. The organic light-emitting device as claimed in claim 17, wherein the electron transport layer includes at least one of $Alq_3$, 2,9-dimethyl-4,7-diphenyl-1,10-phenanthroline (BCP) 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato) aluminum (BAlq), beryllium bis(benzoquinolin-10-olate) ($Bebq_2$), and 9,10-di(naphthalene-2-yl)anthracene (ADN).

19. The organic light-emitting device as claimed in claim 1, wherein the hole transport region includes at least one layer selected from a hole injection layer, a hole transport layer, and an electron blocking layer.

20. The organic light-emitting device as claimed in claim 8, wherein:
a thickness of the first layer ranges from about 5 Å to about 15 Å, and
a thickness of the second layer ranges from about 5 Å to about 15 Å.

21. The organic light-emitting device as claimed in claim 3, wherein a volume ratio of the first component to the second component in the electron injection layer ranges from about 1:1 to about 6:4.

* * * * *